(12) United States Patent
Blank

(10) Patent No.: US 7,137,061 B2
(45) Date of Patent: Nov. 14, 2006

(54) METHOD AND DEVICE FOR SIGNALING A TRANSMISSION FAULT ON A DATA LINE

(75) Inventor: Jürgen Blank, Düsseldorf (DE)

(73) Assignee: Infineon Technologies AG, Munich (DE)

( * ) Notice: Subject to any disclaimer, the term of this patent is extended or adjusted under 35 U.S.C. 154(b) by 616 days.

(21) Appl. No.: 10/642,546

(22) Filed: Aug. 15, 2003

(65) Prior Publication Data

US 2004/0088631 A1 May 6, 2004

(30) Foreign Application Priority Data

Aug. 15, 2002 (DE) .............................. 102 37 696.4

(51) Int. Cl.
*H04B 3/46* (2006.01)
*H04B 14/04* (2006.01)
*H04L 1/00* (2006.01)

(52) U.S. Cl. .................. 714/816; 324/140 R; 324/522; 375/224; 714/712; 714/715

(58) Field of Classification Search ............ 324/140 R, 324/509, 552; 375/224; 714/712, 714, 816
See application file for complete search history.

(56) References Cited

U.S. PATENT DOCUMENTS

| 5,260,664 | A | * | 11/1993 | Graham ...................... 324/522 |
| 5,368,687 | A |   | 11/1994 | Sandhu et al. |
| 5,600,660 | A | * | 2/1997  | Wolf .......................... 714/715 |
| 5,781,585 | A | * | 7/1998  | Dorner et al. .............. 375/224 |
| 6,051,997 | A | * | 4/2000  | Yeung et al. ................. 327/58 |
| 6,418,550 | B1| * | 7/2002  | Heinrich ..................... 714/816 |
| 6,432,779 | B1|   | 8/2002  | Hobbs et al. |
| 6,538,865 | B1|   | 3/2003  | Nagatani et al. |
| 6,764,898 | B1|   | 7/2004  | En et al. |
| 2003/0056031 | A1 | | 3/2003 | Dauerer et al. |
| 2003/0104706 | A1 | | 6/2003 | Mitsuhashi et al. |

FOREIGN PATENT DOCUMENTS

| DE | 33 42 763 A1    | 6/1985 |
| DE | 100 37 489 A1   | 2/2002 |
| JP | 05175174        | 7/1993 |
| JP | 2000216142      | 8/2000 |
| WO | WO 2004/021409  | 3/2004 |
| WO | WO 2004/030049  | 4/2004 |

OTHER PUBLICATIONS

"Process for Selective Etching of Tantalum Oxide" IBM Technical Disclosure Bullentin, IBM Corp., New York, vol. 27, No. 12 May 1985, p. 7238, XP000807046.

(Continued)

*Primary Examiner*—R. Stephen Dildine
(74) *Attorney, Agent, or Firm*—Laurence A. Greenberg; Werner H. Stemer; Ralph E. Locher

(57) ABSTRACT

A method and a configuration produce a fault signal that is suitable for identifying transmission faults when using differential signaling. A first mid-level signal whose potential is in the area of the mid-point between the signal level on a first signal line and a signal level on a second signal line, when a logic "1" is transmitted is compared with a second mid-level signal formed when a logic "0" is transmitted. The fault signal is produced if the discrepancy between the two mid-level signals is greater than a predetermined threshold value.

18 Claims, 5 Drawing Sheets

OTHER PUBLICATIONS

Christenson K., et al. "Selective Wet Etching of High-K Gate Dielectrics" Diffusion and Defect Data, Solid State Data, Part B, Solid State Phenomena, vol. 92, 2003, pp. 129-132, XP008023569.

Bernet J., et al. "Wet Etch Enhancement of HfO2 Films by Implant Processing", Diffusion and Defect Data, Solid State Data, Part B, Solid State Phenomena, vol. 92, 2003, pp. 11-14 XP008029227.
European Search Report EP 04 01 7225.

* cited by examiner

METHOD AND DEVICE FOR SIGNALING A TRANSMISSION FAULT ON A DATA LINE

The present application claims the right of priority with respect to application No. 02 37 696.4 filed in Germany on Aug. 15, 2002.

BACKGROUND OF THE INVENTION

1. Field of the Invention

For communications purposes, data links that use a high data rate ("High-Speed data paths") are preferably configured using differential signaling. The expression "differential signaling" in this case refers to two signal conductors being provided for the transmission of the data signals and are operated with opposite polarity or in antiphase. The standards TIA-LVDS and EIA-LVDS (LVDS: low voltage differential signals/signaling) exist for standardization of differential signaling.

Differential signaling allows smaller signal amplitudes and is less susceptible to disturbances than signal-phase (signal-ended) signaling in which only a single conductor is used for the transmission of a data signal. Single-phase (signal-ended) signaling is particularly suitable when there are a very large number of signals or the signal density is very high, but can be used only to a very restricted extent for the transmission of high bit-rate signals. Owing to the fact that the data rates are rising all the time, systems based on differential signaling are thus becoming increasingly widely used. Even complete bus systems are nowadays configured to use differential signaling.

As the use of differential signaling increases in modern electronic systems, there is an increasing requirement for the capability to electronically test these systems during manufacture before delivery, and in the field. One particularly major aspect in this case is the testing of the signal connections between the individual assemblies and integrated circuits in a system. Even during manufacture, there is an aim to identify at an early stage in particular contact faults, such as short circuits between signal conductors or to supply conductors, and unconnected (open) signal conductors in order to make it possible to rework these before further system integration, and to replace damaged assemblies.

An electronic testing method for the identification of contact faults has become increasingly widely used in recent years, in which all the inputs and outputs of the components in the system are connected to form a serial sampling register, referred to as a boundary scan register.

This method has been standardized by the IEEE Computer Society and has been published under the title "IEEE Standard Test Access Port and Boundary-Scan Architecture" (IEEE Std. 1149.1). The test architecture specified by the IEEE Computer Society is, however, suitable only for the evaluation of single-phase signals and the identification of the contact faults that may possibly occur on the signal conductors with single-phase signals. However, it is not directly possible to use the cited IEEE Standard with the aim of identifying all possible contact faults when using differential signaling.

SUMMARY OF THE INVENTION

It is accordingly an object of the invention to provide a method and a device for signaling a transmission fault on a data line that overcome the above-mentioned disadvantages of the prior art methods and devices of this general type, which are suitable for identification of transmission faults when using differential signaling.

With the foregoing and other objects in view there is provided, in accordance with the invention, a method for producing a fault signal indicating a fault in a transmission of a data signal transmitted using differential signaling on a data line having two signal lines. The method includes comparing a first mid-level value having a potential in an area of a mid-point between a signal level on a first signal line and a signal level on a second signal line when transmitting a logic "1" with a second mid-level value formed when transmitting a logic "0". A fault signal is generated if a discrepancy between the first and second mid-level values exceeds a predetermined threshold value.

The invention provides for the evaluation of a mid-level signal, whose potential is in the area of the mid-point between the two signal levels on the two signal lines, in order to identify a fault. In this case, the expression signal level refers to the respective electrical potential, that is to say the voltage potential on the signal conductors; the expression mid-level is the mean potential, that is to say, so to speak, the "mid-potential" whose potential is at the mid-point between the two potentials on the signal conductors. The invention in this case makes use of the knowledge that when there is no disturbance to a data transmission, the mid-level signal or "mid-potential" between the two signal conductors remains unchanged even when the transmitted boundary information changes, that is to say even when switching takes place from a logic "1" to a logic "0", or vice versa. If, on the other hand, there is a short circuit for example in one of the two signal conductors, for example a short to the ground potential, then the "mid-potential" or mid-level signal is shifted, and this can be used to identify a fault, and thus to produce a fault signal. One particularly major advantage of the method according to the invention is in this case that it can be carried out very easily, specifically because only the mid-potential—that is to say only a single measurement variable—need be observed and evaluated; there is no need for any further measurement variables for the method according to the invention.

Particularly high measurement sensitivity for the method according to the invention is advantageously achieved if the evaluated mid-level signal or the evaluated mid-potential is exactly at the mid-point between two signal levels. Specifically, this is achieved by producing the fault signal in accordance with the following "initiation condition":

$$|(VP[1]+VN[1])/2-(VP[0]+VN[0])/2|>Q \text{ or}$$

$$|(VP[0]+VN[0])/2-(VP[1]+VN[1])/2|>Q$$

The mathematical formula VP[1] denotes the signal level on the first signal line when a logic "1" is transmitted, VP[0] is the signal level on the first signal line when a logic "0" is transmitted, VN[1] is the signal level on the other signal line when a logic "1" is transmitted, VN[0] is the signal level on the other signal line when a logic "0" is transmitted, and Q is the predetermined threshold value.

The tapping off or detection of the mid-level signals or mid-potentials can be carried out particularly easily and this advantageously with the aid of a voltage divider which is connected between the two signal lines; an ohmic-reactive voltage divider can preferably be used in this case, with identical resistors, in order that the mid-level signal is tapped off as exactly as possible.

As already explained above, the signal level for the transmission of a logic "0" and for the transmission of a logic "1" are required for the method according to the invention. Since these levels do not occur at the same time or simultaneously, at least one signal level must be buffer-stored. This can advantageously be done by using a sample and hold device, and it is thus regarded as being advantageous for at least one of the two mid-level signals to be buffer-stored with the aid of a sample and hold device. This can advantageously be done in particular in such a way that the mid-potential when a logic "1" is transmitted is sampled using a sample and hold device and is buffer-stored as an auxiliary measurement variable, with the corresponding mid-potential when the logic "0" is transmitted likewise being sampled and being buffer-stored as another auxiliary measurement variable, and the fault signal being produced when the magnitude of the difference between the two auxiliary measurement variables is greater than the predetermined threshold value. Furthermore, it is regarded as being advantageous for two sample and hold devices to be used for detection of the signal levels, the first of which is used to detect the mid-level signal when a logic "1" is being transmitted and the other sample and hold device is used to detect the mid-level signal when a logic "0" is being transmitted. The measurement variables that are stored by the two sample and hold devices can then be used to produce the fault signal. The association between the sample and hold device and the logic information ("1" or "0") and the associated signal level can in this case be produced in a particularly simple manner if logic "zeros" and "ones" are transmitted alternately at a predetermined clock frequency on the data line, and if the two sample and hold devices which are connected to the data line operate at half the clock frequency and in opposite senses, that is to say phase-shifted through 180°.

Halving the clock rate and shifting the phase through 180° can be achieved in a particularly simple manner, and thus advantageously, with the aid of a toggle flip-flop, to whose input side a predetermined clock frequency is applied and whose output side is connected to the two sample and hold devices, to be precise in such a manner that one output signal from the toggle flip-flop is used as the auxiliary clock signal for the first sample and hold device, and the other output signal from the toggle flip-flop is used as the further auxiliary clock signal for the second sample and hold device.

In order to evaluate the fault signal that is produced using the method according to the invention, it is regarded as being advantageous for the fault signal to be stored in a shift register. In this case, the fault signal can then be subsequently processed in an analogous manner to the "IEEE Standard Test Access Port and Boundary-Scan Architecture" test procedure which was explained initially, all that is necessary to do this is for the shift register to essentially be a boundary scan register in accordance with IEEE Standard cited above, or for a corresponding shift register to be used which is matched to the requirements of differential signaling.

Furthermore, the invention is based on the object of specifying an apparatus for producing a fault signal that is suitable for identification of transmission faults when using differential signaling.

The independent apparatus claim provides for the apparatus to have a comparison device which compares a mid-level signal, whose potential is in the area of the mid-point between the signal level on the first signal line and the signal level on the other signal line when a logic "1" is transmitted with the corresponding mid-level signal when a logic "0" is transmitted, and which produces a fault signal when the discrepancy between the two mid-level signals is greater than a predetermined threshold value.

In the same way as the method according to the invention in this case the apparatus according to the invention makes use of the knowledge that the mid-level signal or the mid-potential between the two signal conductors shifts in the event of a fault. Reference can therefore be made to the above statements relating to the method according to the invention.

Merely for the sake of completeness, it should be mentioned that a comparator can advantageously be used for the comparison of the two mid-level signals.

In order to avoid reflections of the data signal occurring at the interface on the data line to the apparatus according to the invention, it is regarded as being advantageous for the input side of the apparatus to have a line termination which is connected to the data line and whose characteristic impedance is matched to that of the data line.

In addition, it is regarded as advantageous for the apparatus for storing and evaluating a fault situation to be followed by a shift register which is compatible with the boundary scan register as described in the IEEE Standard cited above; a shift register such as this can be constructed in a simple and thus advantageous manner by use of multiplexers and D-flip-flops.

Other features which are considered as characteristic for the invention are set forth in the appended claims.

Although the invention is illustrated and described herein as embodied in a method and a device for signaling a transmission fault on a data line, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
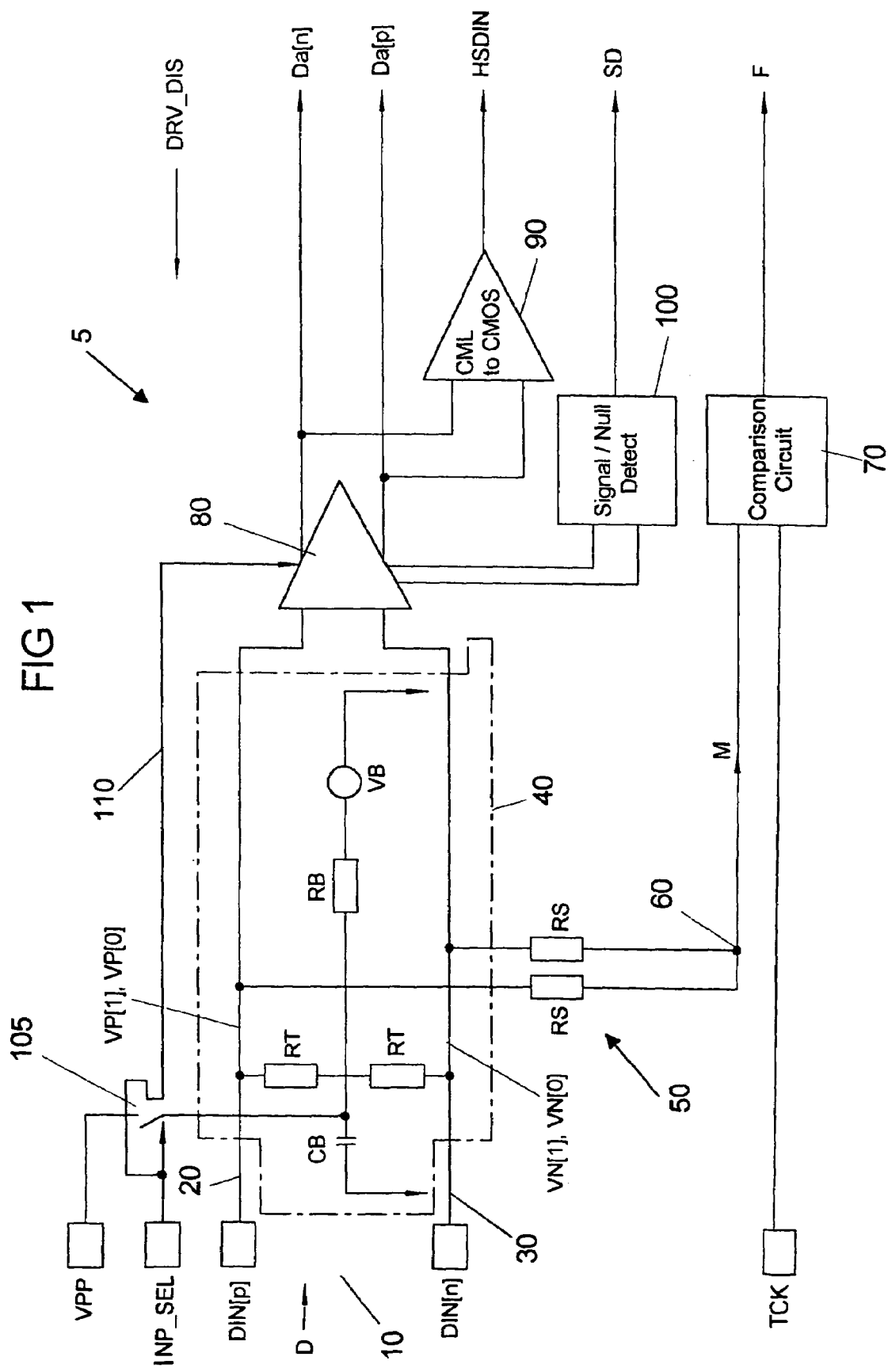
FIG. 1 is a block diagram of an exemplary embodiment of an apparatus according to the invention, which is suitable for carrying out the invention.

Referring now to the figures of the drawing in detail and first, particularly, to FIG. 1 thereof, there is shown an apparatus 5 for producing a fault signal F which indicates that there is a transmission fault in the transmission of a data signal D on a data line 10. The data line 10 shown in FIG. 1 is formed by two signal lines 20 and 30 and is operated using differential transmission techniques. Therefore, the signal elements DIN[p] and DIN[n] which are transmitted on the two signal lines 20 and 30 have a phase shift between them of 180° or π.

The first signal element DIN[p] on the one signal line 20 in this case has two different signal levels, to be precise a signal level VP[1] for the transmission of a logic "1" and a signal level VP[0], which is not the same as VP[1], for the transmission of a logic "0".

A corresponding situation applies to the other signal element DIN[n], which likewise has two different signal levels. A signal level VN[1] is used for transmission of a logic "1" and a signal VN[0] which is not the same as VN[1], is used for transmission of a logic "0".

The phase shift of 180° or π results in that, when there are no faults, the signal level VP[1] and VN[0] as well as the signal levels VP[0] and VN[1] are of the same magnitude. In the event of a fault, for example when a short circuit to ground occurs, the signal levels change, however; for example in the event of a short circuit to ground, the faulty signal conductor is drawn to a signal level of 0 volts.

A line termination 40 is connected to the data line 10 and is formed by two resistors RT as well as a resistor RB and a capacitor CB for presetting and stabilizing a line connection voltage VB. The resistors RT are in this case chosen such that an input impedance of the apparatus 5 is matched to the characteristic impedance of the data line 10; normal characteristic impedances are, for example 50 and 75 ohms.

A voltage divider 50 having two resistors RS (RS preferably has a high resistance in comparison to the line termination resistors RT) is connected to the data line 10 and these resistors have the same resistance value. A potential which is exactly at the mid-point between the potential VP on the first signal line 20 and the potential VN on the other signal line 30 is thus produced at an output 60 of the voltage divider 50; in the following text, the potential is referred to as the mid-potential or mid-level signal M. The value of the mid-level signal is calculated to be:

$M=(VP[1]+VN[1])/2$ for a logic "1"

$M=(VP[0]+VN[0])/2$ for a logic "0".

The mid-level signal is applied to a comparison device 70 whose output side produces a fault signal F when a transmission fault occurs. The method of operation of the comparison device 70 will be explained further below in conjunction with FIG. 2.

In addition, the apparatus 5 also has an amplifier 80 for signal processing. The two signal elements DIN[p] and DIN[n] are applied to the input side of the amplifier 80. The amplifier 80 uses these signal elements, for example, to produce processed and amplified differential output data signal Da[n] and Da[p] which are supplied to a "CML-CMOS" conversion module 90 (CML: current mode logic) and to a "Signal/Null-Detect" circuit 100. The conversion module 90 converts the differential output data signals Da[n] and Da[p] to an output signal HSDIN which is suitable for transmission on a single line and which is thus a single-ended signal. The output signal HSDIN is in this case a CMOS-compatible signal.

The Signal/Null-Detect circuit 100 is formed by a comparison module and emits as its output signal SD a logic "1" when there is a sufficiently large voltage differential between the two differential signal elements DIN[p] and DIN[n]. Conversely, a logic "0" is emitted when the input voltage difference is too small. The Signal/Null-Detect circuit 100 in this case makes use of the fact that, with differential signaling, there is always a voltage difference between the two signal lines during data transmission, irrespective of whether the logic "1" or a logic "0" is being transmitted. The Signal/Null-Detect circuit 100 may, for example, be formed by a comparator.

Furthermore, FIG. 1 shows a control line 110. The operating mode of the amplifier 80 can be switched via the control line 110 to be precise via a control signal INP_SEL which is transmitted via the control line 110. The control signal INP_SEL also switches the line termination voltage between VP and VPP, to be precise via a switch 105.

Figure 2:
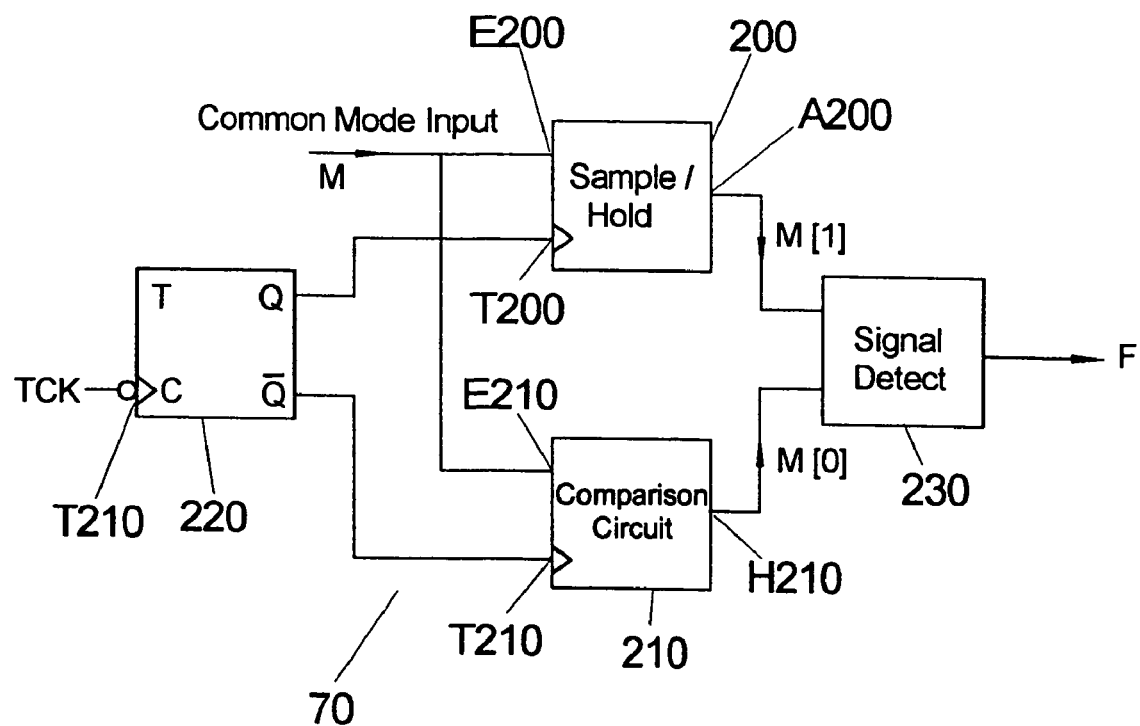
FIG. 2 is a block diagram of an exemplary embodiment of a comparison device, as can be used in the apparatus shown in FIG. 1.

FIG. 2 shows an exemplary embodiment of the comparison device 70 as shown in FIG. 1. This shows two sample and hold devices 200 and 210, to the respective inputs, E200 and E210, to both of which the mid-level signal M is applied. The two sample and hold devices 200 and 210 are each connected to a toggle flip-flop by their respective clock inputs T200 and T210 which are edge-triggered and react to the rising edge.

Specifically, a clock input T200 of the first sample and hold device 200 is connected to an output Q of the toggle flip-flop 220, and a clock input T210 of the other sample and hold device 210 is connected to the other output $\overline{Q}$ of the toggle flip-flop 220. A clock signal TCK is applied on the input side of the toggle flip-flop 220, to be precise at an edge-triggered clock input T220 which reacts to the falling edge.

The two sample and hold devices 200 and 210 are each connected on the output side to a comparison circuit 230.

The method of operation of the apparatus 5 shown in FIG. 1 will now be explained in conjunction with FIGS. 2, 4 and 5.

In order to test the data line 10, the data signal D is transmitted via the data line 10. The date signal D contains a bit sequence, which alternates at a predetermined clock rate T and is composed of logic "zeros" and "ones"; the clock T is in this case predetermined by the clock signal TCK.

Figure 4:
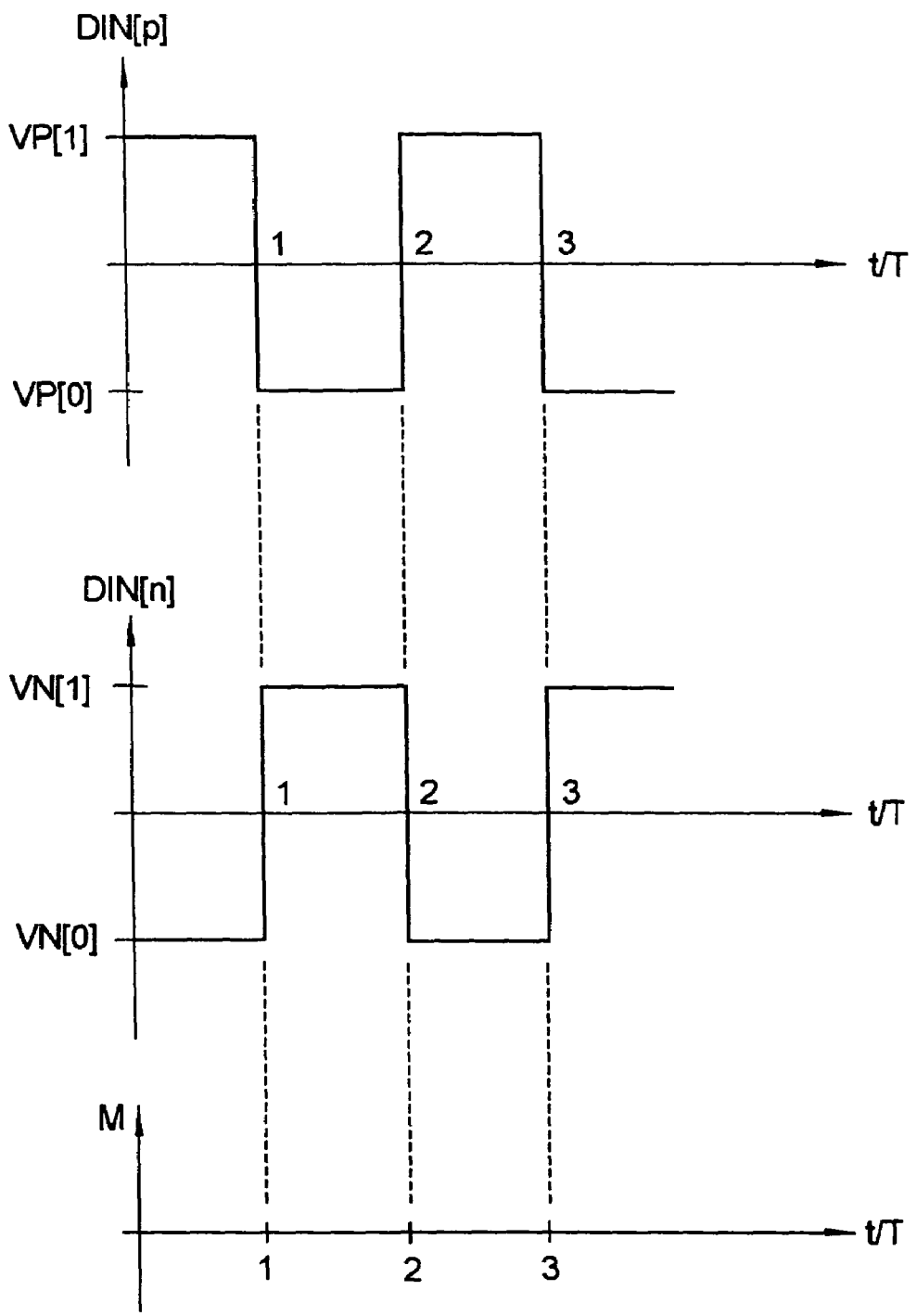
FIG. 4 is a graph showing an exemplary embodiment of a data signal which is applied to the apparatus shown in FIG. 1 during operation without any faults.
Figure 5:
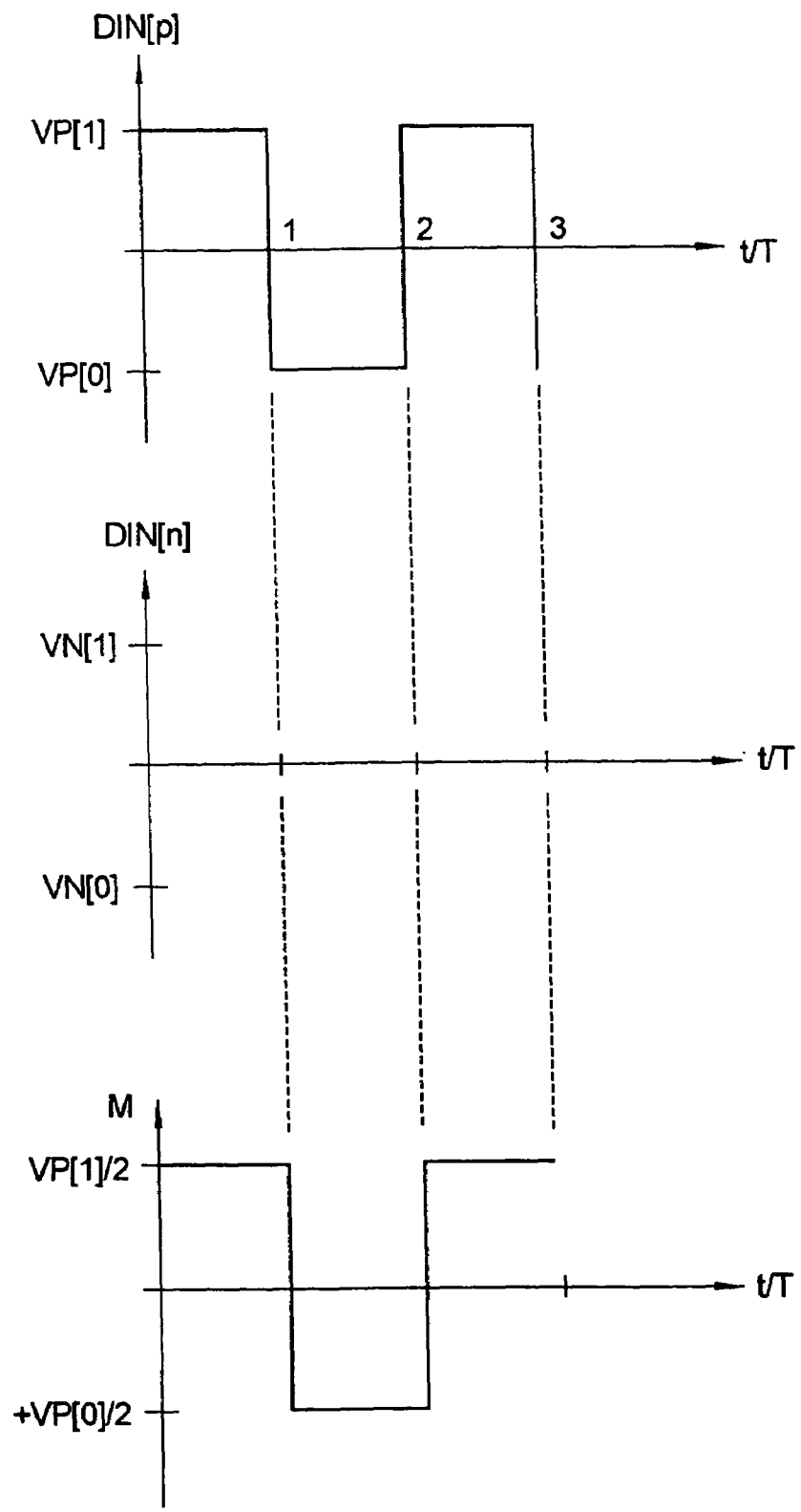
FIG. 5 is a graph showing an exemplary embodiment of a data signal which is applied to the apparatus shown in FIG. 1 when a fault is present.

By way of example, FIG. 4 shows signal elements DIN[p] and DIN[n] which are associated with the data signal D on the two signal lines 20 and 30 when there are no faults; FIG. 5 shows the signal elements when, for example, there is one fault. This illustrates the situation if the signal line 30 is not carrying a signal because of the fault.

In the example shown in FIG. 4 the two signal elements are phase-shifted through 180°, so that VP[1]=VN[0] and VP[0]=VN[1]. Furthermore, the magnitudes of each of the two signal elements should be the same; therefore they should both each be centered about the mid-level.

As can be seen from FIG. 4, the mid-level signal M which is formed at the output 60 of the voltage divider 50 is always the same when no faults are present while, in contrast, it changes its potential at the clock frequency when a fault is present (see FIG. 5), to be precise from VP[1]/2 to VP[0]/2 and vice versa.

The potential change in now identified in the comparison device 70 as shown in FIG. 2, as will be explained with reference to FIG. 2. The edge-controlled toggle flip-flop 220 as shown in FIG. 2 operates as a frequency divider since its two output signals Q and $\overline{Q}$ only ever switch on a falling edge of the clock signal TCK. The output signals Q and $\overline{Q}$ on the toggle flip-flop 220 are in this case inverted with respect to one another, or are phase-shifted through 180° with respect to one another. Therefore, the two sample and hold devices 200 and 210 operate in opposite senses. If—as already mentioned above—a bit sequence which contains logic "zeros" and logic "ones" alternately is now transmitted at the clock frequency TCK via the data line 10 then the first sample and hold device 200 always, for example, samples the logic "ones" and the second sample and hold device 210 in each case samples the logic "zeros" specifically because each of the two sample and hold devices 200 and 210 each detect only every alternate bit since the toggle flip-flop 220 is operating at half the frequency.

Thus, by way of example, the sample voltage or the sample value for the mid-level signal M[1] for a logic "1" is produced at the output A200 of the first sample and hold device 200; the sample voltage or the sample value for the mid-level signal M[0] in the case of a logic "0" is produced by the second sample and hold device 210 at the output A210. In this context, it shall be mentioned that it is irrelevant to the operation of the apparatus 5 or to the operation of the comparison circuit 70 whether the logic "1" is sampled by the first or the second sample and hold device; furthermore, the time sequence of the sampling of the logic "0" and "1" is not important either.

In the comparison device 230, the difference voltage between the two sample values or between the two sample voltages of the two mid-values M is compared, for example by a comparator, with a predetermined threshold value and the fault signal F is produced if the discrepancy between the two sample voltages or between the two sample values is greater than the predetermined threshold value, that is to say if the difference voltage between M[1] and M[0] is greater than the predetermined threshold.

Figure 3:
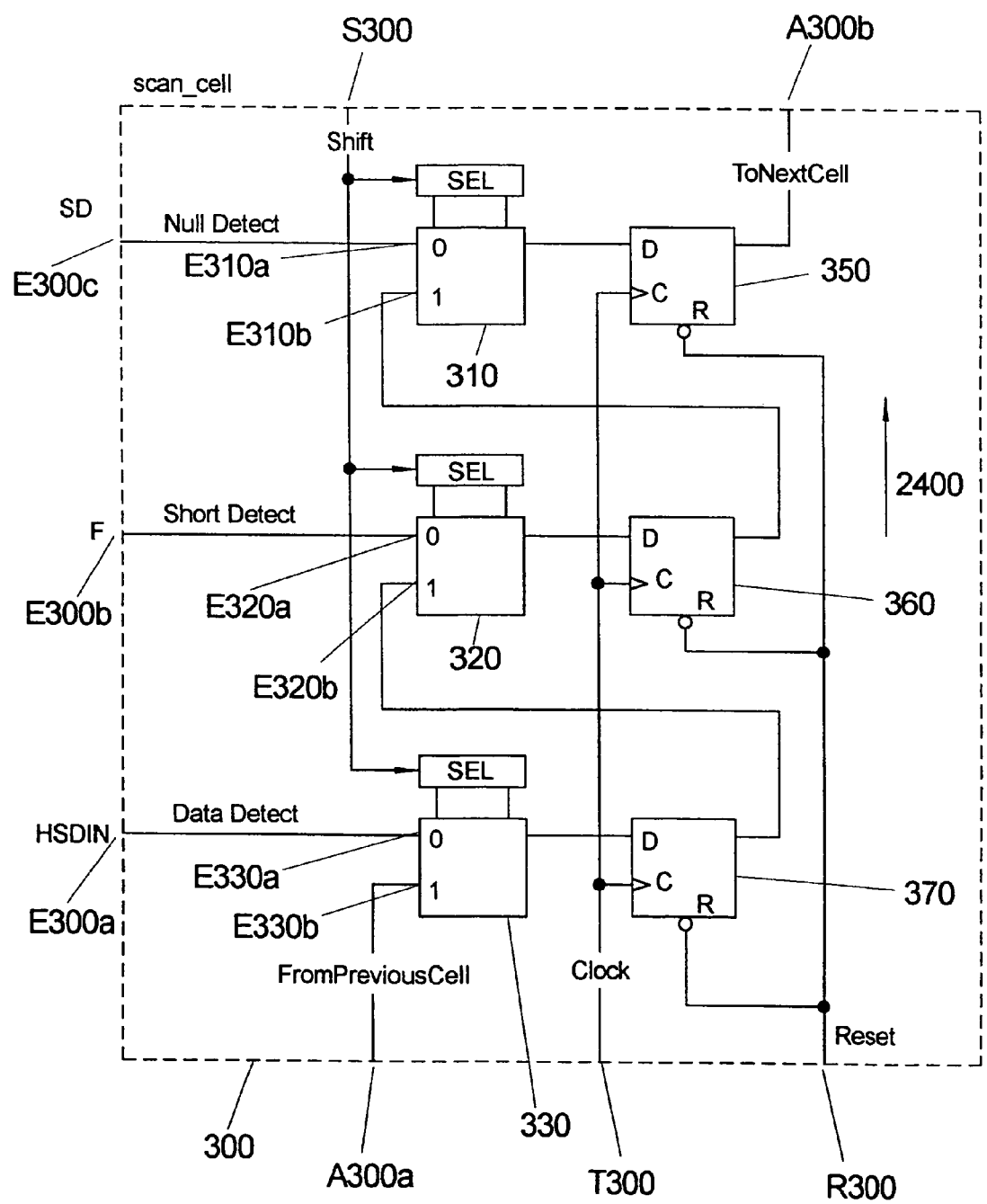
FIG. 3 is a block diagram of an exemplary embodiment of a shift register that can be disposed downstream from the comparison device shown in FIG. 2.

FIG. 3 shows an exemplary embodiment of a shift register cell 300 in which the signals F, SD and HSDIN which are produced by the apparatus 5 shown in FIG. 1 can be buffer-stored for further processing. The buffer-storage process is particularly advantageous if the signals that are produced are intended to be evaluated by analogous use of the "IEEE Standard Test Access Port and Boundary-Scan Architecture" cited above.

The memory register cell 300 has a first data input E300a, at which the signal HSDIN can be fed in into the shift register cell 300. The signal HSDIN can be used, for example, to store whether the test sequence mentioned above and composed of logic "zeros" and "ones" started with a logic "zero" or with a logic "one".

The shift register cell 300 has a second data input E300b, at which the fault signal F can be fed in. The output signal SD from the Signal/Null-detect circuit 100 is fed in at the third data input E300c.

In addition, the memory register cell 300 has connections A300a and A300b, by which the illustrated memory register cell 300 can be connected to corresponding further cells.

The contents of the memory register cell 300 can be erased via a reset input R300. The memory register cell 300 is supplied with a clock signal and a clock input T300.

Furthermore, the memory register cell 300 has a shift input S300.

The input of the shift register cell 300 is formed by three multiplexers 310, 320 and 330 that are connected to the inputs E300a, E300b and E300c. Each of the multiplexers 310, 320 and 330 has a select input SEL; if a logic "0" is applied to the select input SEL, then the signal which is in each case applied in FIG. 3 to an input which is denoted under "0" (E310a, E320a, E330a) is passed on, to be precise to a respective downstream D flip-flop 350, 360 or 370. If, in contrast, a logic "1" is applied to the shift input S300 and thus to the select inputs SEL of the multiplexers 310, 320 and 330, then the signal which is applied to the respective input (E310b, E320b, in E330b) annotated "1" in FIG. 3 is in each case passed to the respectively associated D flip-flop 350, 360 or 370.

Since the output of the D flip-flop 370 is connected to the input 320b of the multiplexer 320, and the output of the D flip-flop 360 is connected to the input E310b of the multiplexer 310 and the output of the D flip-flop 350 is in turn connected to the input of a multiplexer which is no longer shown in FIG. 3, of a memory register cell which is no longer illustrated either, this effectively results in the data in the memory register cell 300 being "shifted up" along the arrow direction indicated by arrow 400 when a logic "1" is applied to the shift signal S300.

Each of the D flip-flops 350, 360 and 370 is in each case connected to the reset input, A300 and to the clock input T300. All the D flip-flops 350, 360 and 370 can be erased via the reset input A300; all the D flip-flops 350, 360 and 370 are clocked at the same clock frequency via the clock input T300.

I claim:

1. A method for producing a fault signal indicating a fault in a transmission of a data signal transmitted using differential signaling on a data line having two signal lines, which comprises the steps of:

comparing a first mid-level value having a potential in an area of a mid-point between a signal level on a first signal line and a signal level on a second signal line when transmitting a logic "1" with a second mid-level value formed when transmitting a logic "0"; and generating the fault signal if a discrepancy between the first and second mid-level values exceeds a predetermined threshold value.

2. The method according to claim 1, which further comprises:

forming the fault signal when:

$|(VP[1]+VN[1])/2 - (VP[0]+VN[0])/2| > Q$ is satisfied, where

VP[1] is the signal level on the first signal line when the logic "1" is transmitted, VP[0] is the signal level on the first signal line when the logic "0" is transmitted, VN[1] is the signal level on the second signal line when the logic "1" is transmitted, VN[0] is the signal level on the second signal line when the logic "0" is transmitted, and Q is the predetermined threshold value.

3. The method according to claim 1, which further comprises tapping off the first and second mid-level values from a voltage divider connected to the first and second signal lines.

4. The method according to claim 3, which further comprises using two series ohmic resistors for forming the voltage divider.

5. The method according to claim 4, which further comprises forming the two series ohmic resistors with identical resistance values.

6. The method according to claim 1, which further comprises:

sampling the first mid-level value when the logic "1" is transmitted using a sample and hold device and buffer-storing the first mid-level value as a first auxiliary measurement variable;

sampling the second mid-level value when the logic "0" is transmitted and buffer-storing the second mid-level value as a second auxiliary measurement variable; and producing the fault signal if a distance between magnitudes of the first and second auxiliary measurement variables is greater than the predetermined threshold value.

7. The method according to claim 6, which further comprises:
transmitting logic "ones" and logic "zeros" alternately at a predetermined clock frequency via the data line using a clock; and
operating two sample and hold devices at half the predetermined clock frequency, using a first sample and hold device for determining the first auxiliary measurement variable and using a second sample and hold device for determining the second auxiliary measurement variable with the two sample and hold devices being operated in opposite senses such that they alternately sample a mid-level value between the first and second signal lines.

8. The method according to claim 7, which further comprises:
using a toggle flip-flop having an input side receiving the predetermined clock frequency to drive the two sample and hold devices;
using a first output signal from the toggle flip-flop as an auxiliary clock signal for the first sample and hold device; and
using a second output signal from the toggle flip-flop as a further auxiliary clock signal for the second sample and hold device.

9. The method according to claim 1, which further comprises storing the fault signal as a status signal indicating a fault in a shift register.

10. The method according to claim 9, which further comprises using a boundary scan register which is compatible with the IEEE Standard Test Access Port and Boundary-Scan Architecture as the shift register.

11. An apparatus for producing a fault signal indicating a fault during a transmission of a data signal transmitted using differential signaling on a data line having a first signal line and a second signal line, the apparatus comprising:
a comparison device connected to the data line for comparing a first mid-level signal having a potential in an area of a mid-point between a signal level on the first signal level line and a signal level on the second signal line when transmitting a logic "1" with a second mid-level signal formed when transmitting a logic "0", said comparison device producing the fault signal if a discrepancy between the first and second mid-level signals being greater than a predetermined threshold value.

12. The apparatus according to claim 11, further comprising a line termination connected to the data line, said line termination serving as an input side for the apparatus and having a characteristic impedance matched to that of the data line.

13. The apparatus according to claim 11, further comprising a voltage divider electrically connected between said comparison device and the data line.

14. The apparatus according to claim 13, wherein said comparison device has at least one sample and hold device.

15. The apparatus according to claim 13, wherein said comparison device has:
a toggle flip-flop having an output and an inverted output; and
two sample and hold devices, including a first sample and hold device and a second sample and hold device, each connected to said voltage divider, each having a clock input, and producing output signals, said output of said toggle flip-flop connected to said clock input of said first sampled and hold device, and said inverted output of said toggle flip-flop connected to said clock input of said second sample and hold device.

16. The apparatus according to claim 15, wherein said comparison device has a comparator having inputs connected to and receiving the output signals from said two sample and hold devices, said comparator having an output and producing the fault signal available at said output.

17. The apparatus according to claim 11, further comprising a memory device for storing the fault signal, said memory device connected to said comparison device.

18. The apparatus according to claim 17, wherein said memory device is a shift register having multiplexers and D flip-flops connected to said multiplexers.

* * * * *

UNITED STATES PATENT AND TRADEMARK OFFICE
CERTIFICATE OF CORRECTION

PATENT NO. : 7,137,061 B2  
APPLICATION NO. : 10/642546  
DATED : November 14, 2006  
INVENTOR(S) : Jurgen Blank Page 1 of 1

It is certified that error appears in the above-identified patent and that said Letters Patent is hereby corrected as shown below:

Title Page, Item (56) Column 2 (Other Publications), Line 2, delete "Bullentin" and insert --Bulletin --;

Column 1, Line 5, delete "02 37 696.4" and insert -- 102 37 696.4 --.

Signed and Sealed this

Twenty-sixth Day of October, 2010

David J. Kappos  
*Director of the United States Patent and Trademark Office*